(12) United States Patent
Dorok et al.

(10) Patent No.: US 8,764,462 B2
(45) Date of Patent: Jul. 1, 2014

(54) SEMICONDUCTOR COMPONENT

(75) Inventors: Sascha Dorok, Dresden (DE); Rudolf Lessmann, Duesseldorf (DE); Tobias Canzler, Dresden (DE); Qiang Huang, Dresden (DE); Christiane Koehn, Dresden (DE)

(73) Assignee: Novaled AG, Dresden (DE)

( * ) Notice: Subject to any disclaimer, the term of this patent is extended or adjusted under 35 U.S.C. 154(b) by 0 days.

(21) Appl. No.: 13/811,156

(22) PCT Filed: Jul. 21, 2011

(86) PCT No.: PCT/DE2011/075172
§ 371 (c)(1),
(2), (4) Date: Apr. 29, 2013

(87) PCT Pub. No.: WO2012/022342
PCT Pub. Date: Feb. 23, 2012

(65) Prior Publication Data
US 2013/0210192 A1    Aug. 15, 2013

(30) Foreign Application Priority Data
Jul. 22, 2010  (DE) .......................... 10 2010 031 979

(51) Int. Cl.
H01L 51/40    (2006.01)
H01L 29/08    (2006.01)
H01L 35/24    (2006.01)
H01L 51/00    (2006.01)

(52) U.S. Cl.
USPC ............... 439/99; 257/40; 257/290; 257/292

(58) Field of Classification Search
USPC ............................................ 257/40; 438/99
See application file for complete search history.

(56) References Cited

U.S. PATENT DOCUMENTS 6,326,640 B1 * 12/2001 Shi et al. .......................... 257/40
7,151,007 B2    12/2006 Werner et al.
(Continued)

FOREIGN PATENT DOCUMENTS

EP    2 180 029 A1    4/2010
EP    2 194 582 A1    6/2010
JP    2004-327829 A    11/2004

OTHER PUBLICATIONS

PCT International Preliminary Report on Patentability for PCT Application No. PCT/DE2011/075172 mailed Jan. 31, 2013 (English translation) (11 pages).

(Continued)

*Primary Examiner* — Karen Kusumakar
(74) *Attorney, Agent, or Firm* — Sutherland Asbill & Brennan LLP

(57) ABSTRACT

The invention concerns a semiconductor component with a layered arrangement with an electrode, an organic semiconductor layer, an injection layer, and an additive layer, which consists of an additive, which on contact with the molecular doping material modifies its doping affinity with respect to the organic material of the organic semiconductor layer, wherein in the injection layer a layered region is formed with a first doping affinity of the molecular doping material with respect to the organic material and a further layered region is formed with a second, in comparison to the first doping affinity smaller, doping affinity of the molecular doping material with respect to the organic material. Furthermore the invention concerns a method for the manufacture of a semiconductor component and also the application of a semiconductor component.

14 Claims, 4 Drawing Sheets

(56) References Cited

U.S. PATENT DOCUMENTS

| | | |
|---|---|---|
| 7,858,967 B2 | 12/2010 | Pfeiffer et al. |
| 8,071,976 B2 | 12/2011 | Huang et al. |
| 8,258,501 B2 | 9/2012 | Werner et al. |
| 2003/0127967 A1* | 7/2003 | Tsutsui et al. ............ 313/498 |
| 2005/0110007 A1* | 5/2005 | Forrest et al. ............ 257/40 |
| 2005/0121667 A1 | 6/2005 | Kuehl et al. |
| 2005/0242342 A1 | 11/2005 | Suh et al. |
| 2006/0033098 A1 | 2/2006 | Shih et al. |
| 2007/0096085 A1* | 5/2007 | Rand et al. ............ 257/40 |
| 2007/0278479 A1 | 12/2007 | Werner et al. |
| 2008/0265216 A1 | 10/2008 | Hartmann et al. |
| 2009/0009071 A1 | 1/2009 | Murano et al. |

OTHER PUBLICATIONS

Takashima et al., "Unipolarization of Ambipolar Organic Field Effect Transistors Toward High-Impedance Complementary Metal-Oxide-Semiconductor Circuits," Applied Physics Letters, 2007, 91(071905-1 through 071905-3).

PCT International Search Report for PCT/DE2011/075172 mailed Jan. 23, 2012 (English translation).

* cited by examiner

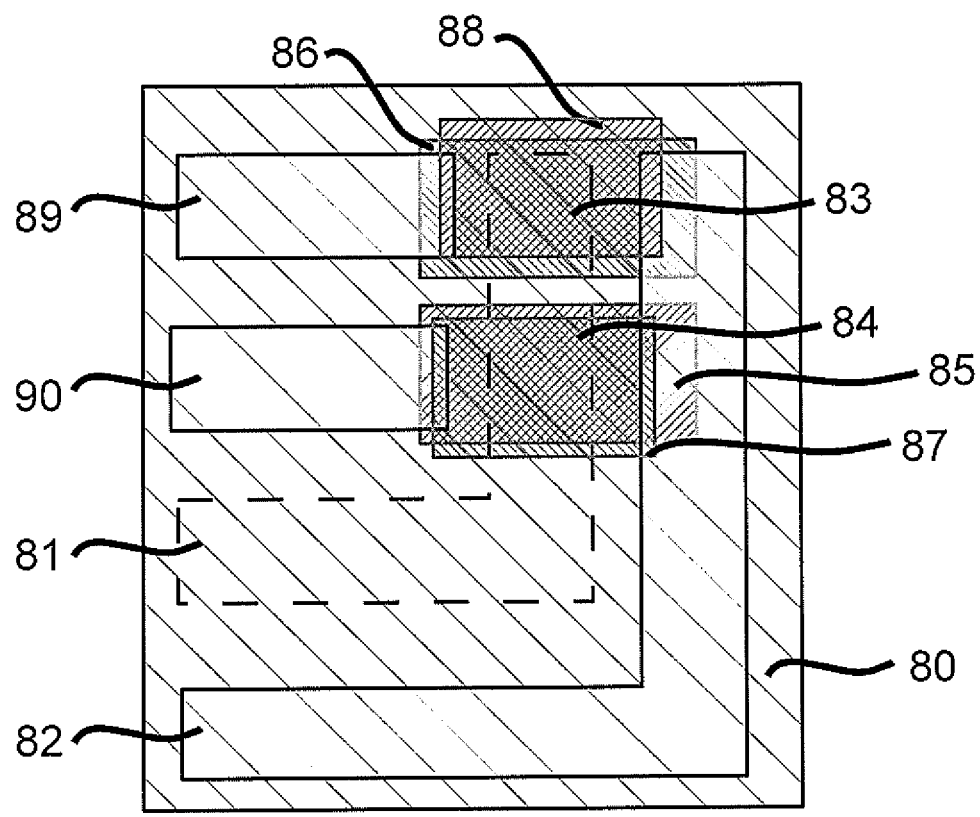
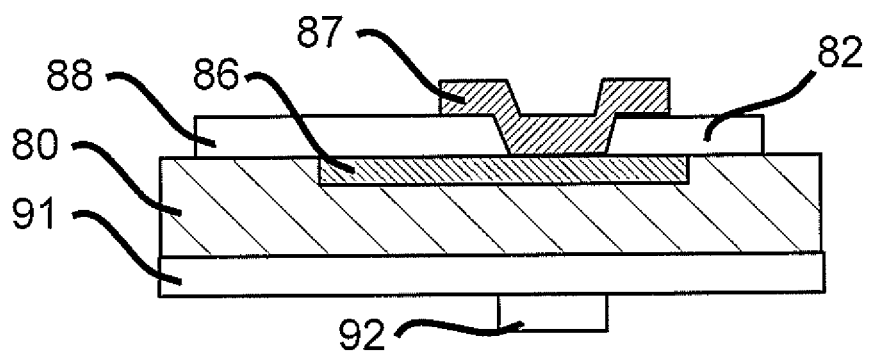
Fig. 6a
Fig. 6b

SEMICONDUCTOR COMPONENT

FIELD OF THE INVENTION

The invention concerns a semiconductor component.

BACKGROUND OF THE INVENTION

In the context of semiconductor components it is of known art, in a layered arrangement of the component, to arrange a so-called injection layer between an electrode and an oppositely formed organic semiconductor layer of organic material. The document EP 1 806 795 A1, for example, describes an organic component with such an injection layer, in particular for a light-emitting organic component. By means of the injection layer, which consists of molecular doping materials, it has been found that an improved injection of charge carriers into the organic semiconductor layer adjacent to the injection layer is achieved during operation of the component.

In the manufacture of such layered arrangements for semiconductor components it comes about for technical reasons associated with the process that the injection layer is formed over a larger surface area than is necessary for the optimisation of the charge carrier injection. In some circumstances the influence of the injection layer in certain regions that are, however, covered with the layer, is then not at all desirable. By way of example FIG. 1 shows a schematic representation of an organic field effect transistor, in which the drain and source electrodes 1, 2 are formed on a structured injection layer of a molecular doping material. For its part the injection layer 3 is arranged on a stack with a channel layer 4 and an insulator layer 5, wherein the latter is coupled to the further electrode gate 6. Structuring of the injection layer 3 can be very complex in some circumstances. The action of the injection layer 3 that optimises the charge carrier injection is desired in regions underneath the source and drain electrodes 1, 2. In an intermediate region 7 on the other hand, where the injection layer 3, in the case of a non-structured embodiment, would also be formed, the action on the channel layer 4 is not desired. For this reason the injection layer 3 is usually only manufactured in a structured manner.

There is therefore a need for technologies to improve the utilisation of injection layers in semiconductor components.

From the document DE 10 2008 036 062 A1 an organic field effect transistor is of known art. In one configuration the field effect transistor has a layered arrangement with an active layer, on which is arranged a partial layer of a matrix material, such that the active layer is covered by the partial layer in certain regions. The partial layer is itself then covered by a charge carrier injection layer, which outside the region of the partial layer is in direct contact with the active layer. The electrodes of the transistor are applied onto the charge carrier injection layer.

BRIEF SUMMARY

The object of the invention is to provide an improved semiconductor component, and also a method for its manufacture, in which the opportunities for deployment of injection layers, and their designs for specific applications, are optimised.

This object is inventively achieved by means of a semiconductor component having a layered arrangement with an electrode of an electrode material, an organic semiconductor layer of an organic material, an injection layer, which is arranged between the electrode and the organic semiconductor layer, and consists of a molecular doping material, which is an electrical dopant for the organic material of the organic semiconductor layer, and an additive layer, which is arranged on the injection layer on the side of the injection layer facing towards the electrode, and consists of an additive material, which on contact with the molecular doping material modifies its doping affinity with respect to the organic material of the organic semiconductor layer, wherein in the injection layer a layered region is formed with a first doping affinity of the molecular doping material with respect to the organic material, and a further layered region is formed with a second in comparison to the first doping affinity smaller, doping affinity of the molecular doping material with respect to the organic material; and also by means of a method for producing a semiconductor component, wherein the method comprises the following steps producing an electrode of an electrode material producing an organic semiconductor layer of an organic material, producing an injection layer, which is formed between the electrode and the organic semiconductor layer, and is produced consisting of a molecular doping material, which is an electrical dopant for the organic material of the organic semiconductor layer, and producing an additive layer, which is formed on the injection layer on the side of the injection layer facing towards the electrode, and is produced consisting of an additive material, which on contact with the molecular doping material and/or subsequent activation with the molecular doping material modifies its doping affinity with respect to the organic material of the organic semiconductor layer, wherein in the injection layer a layered region is formed with a first doping affinity of the molecular doping material with respect to the organic material, and a further layered region is formed with a second in comparison to the first doping affinity smaller, doping affinity of the molecular doping material with respect to the organic material. Furthermore the application of the semiconductor component is proposed in an organic transistor or a passive matrix display. Furthermore an inverter with two semiconductor components is proposed.

With the invention the opportunity is created in the proposed injection layer of molecular doping material of designing a type of structure such that regions with a first doping affinity and regions with a second doping affinity are manufactured, wherein the second doping affinity of the molecular doping material of the additive layer, with reference to the organic material of the organic semiconductor layer that is adjacent to the latter, is less than the first doping affinity. The molecular doping material can take the form of an organic or an inorganic doping material.

The invention has the advantage that a lateral conductivity, which is provided through the injection layer, is reduced, because interfacial doping is reduced. In this manner crosstalk is also avoided. In the case of the component of known art in FIG. 1 the injection layer in the central region has been chemically deactivated, and thus the local conductivity has been suppressed.

Particularly advantageous results are achieved with undoped semiconductor layers. The proposed technology can in particular be efficiently deployed in very compact geometries, where the lateral separation between electrodes is less than 50 µm, preferably less than 10 µm.

The doping affinity of the molecular doping material forms a measure for the extent to which the molecular doping material located in the respective region of the injection layer actually effects electrical doping (or injection improvement) of the organic material in regions of the organic semiconductor layer adjacent to the latter. The doping affinity is proportional to the spatial density of free dopants in the material. The electrical doping is based on a partial charge transfer between the doping material and the organic material of the organic semiconductor layer, wherein the latter hereby forms the so-called matrix material.

The injection layer serves in general to improve the injection of charge carriers in the component. The interfacial surface between the injection layer and the organic semiconductor layer lying underneath it is preferably formed so as to be continuous, in particular it is not interrupted by the additive layer, which for its part is arranged above the injection layer, that is to say, on the side of the injection layer that faces away from the organic semiconductor layer, and faces towards the electrode or electrodes. In this respect the additive layer is then free from any direct contact with the organic semiconductor layer. The material acts indirectly (in an inhibiting manner) on the electrical doping effect of the injection layer material into the organic semiconductor layer.

The proposed technology improves the component in that the doping effect does not take place inadvertently as a result of undesired doping or undesired diffusion. In the layered regions of the injection layer with the first doping affinity the molecular doping material of the injection layer can develop its electrical injection improvement between the electrodes and adjacent organic semiconductor layer without any interference as a result of any action of the additive material from the additive layer. In contrast, in the further layered regions that are formed adjacent to the interfacial surface regions between the additive layer and the injection layer, the additive material from the additive layer inhibits the action of the molecular doping material from the injection layer causing any undesired electrical doping of the adjacent organic material in the organic semiconductor layer. The latter can lead to a complete inhibition (neutralisation) of an electrical doping action, at least in parts of the said further layered regions.

In this manner the design of layered regions in the injection layer with a different doping action for the material of the adjacent organic semiconductor layer is enabled. In the case of the organic field effect transistor this means, for example, that in a region of the injection layer between adjacent electrodes of the transistor an electrical doping effect of the material of the injection layer for the adjacent channel layer can be reduced or totally neutralised.

One measure for the undesired electrical doping action of the molecular doping material from the injection layer in the regions with the smaller doping affinity with reference to the material of the adjacent organic semiconductor layer is, for example, the extent to which molecules of the molecular doping material penetrate into the adjacent organic semiconductor layer, so that an electrical doping of the molecules of the organic material of the organic semiconductor layer can take place there locally. The said mixing affinity is inhibited or totally prevented with the aid of the material of the additive layer. Material combinations and layer thickness variations can readily be determined experimentally, in order to determine the influence of the doping affinity. For this purpose it is simply necessary to compare the application in layers of appropriate layers from the materials that are to be investigated, in order then to compare the current flow when voltage is applied for different layered structures.

Molecular doping materials for the injection layer are molecular substances that can be deposited to form layers by means of vacuum vaporisation without decomposition as a layer (solid body). These take the form of organic or inorganic substances, whose molecules comprise at least six atoms, preferably more than 20 atoms. Covalent compounds are preferred.

A development of the invention envisages that:
the injection layer is formed in contact with the electrode and the organic semiconductor layer, such that a first interfacial surface region is formed between the electrode and the injection layer,
the additive layer is arranged on the injection layer, on the side of the injection layer facing towards the electrode, so that a second interfacial surface region is formed between the additive layer and the injection layer, and
in the injection layer the layered region is formed opposite to the first interfacial surface region, and the further layered region is formed opposite to the second interfacial surface region.

A preferred development of the invention envisages that the molecular doping material has a molecular weight of at least 300 g/mol.

In one advantageous configuration of the invention provision can be made for the first interfacial surface region and the second interfacial surface region to be formed adjacent to one another. In one form of embodiment an essentially continuous transition between the interfacial surface regions can hereby be formed.

One advantageous form of embodiment of the invention envisages that for the organic material of the organic semiconductor layer the molecular doping material of the injection layer is an electrical p-dopant, and the additive material of the additive layer is an electrical n-dopant, or vice versa. Since p-dopants are strong acceptors and n-dopants are strong donors, the two react with one another, so that a type of salt is generated, which no longer has the previously existing doping affinity and in addition is electrically non-conducting. In the sense used here "electrically non-conducting" means that the salt under normal operating conditions does not impair the function of the organic components, in particular there is no cross-talk between adjacent lines that border onto an organic region, and/or that the reverse leakage current of a transistor is very low.

One development of the invention preferably envisages that the additive material contains a material diminishing the doping affinity of the molecular doping material with reference to the organic material by means of a chemical reaction between the additive material and the molecular doping material. The molecular doping material and the additive material from the additive layer hereby react chemically with one another, such that one or a plurality of new chemical compounds are created, which no longer have the doping strength and/or the electrical conductivity of the original molecular doping material from the injection layer. In the said, and other, forms of embodiment the additive material acts as a kind of neutralising or compensating material with reference to the doping strength of the molecular doping material in the injection layer.

In one advantageous configuration of the invention provision can be made for the additive material to contain a material diminishing the doping affinity of the molecular doping material with reference to the organic material by means of formation of a salt between the additive material and the molecular doping material.

In one development of the invention provision can be made for the additive layer to cover at least partially the electrode on a side of the electrode facing away from the injection layer. The additive layer covering the electrode can be formed in a continuous manner. Provision can be made for the electrode to be fully covered by the additive layer. In the manufacture of the layered arrangement with the application of shadow mask technology the said forms of embodiment have the advantage that exact positioning of the respective shadow mask with reference to the electrode and/or other layered regions is not necessary. The manufacturing process is simplified. Also roll-to-roll (R2R) methods are in this manner simplified. In the prior art metal and organic layers are manufactured in very exactly defined positions, with different masks, for example. In the method here proposed one mask can be saved.

In one preferred development of the invention provision can be made for the additive layer to be formed between the electrodes and at least one further electrode. Such an electrode arrangement can, for example, be provided in an organic field effect transistor.

The lateral dimension of the additive layer (parallel to the channel width) is preferably greater than the channel width in the component, that is to say, the dimension between the two electrodes, such that the additive layer projects beyond the electrodes.

The semiconductor layer is preferably formed undoped (electrically not doped). With reference to the method for manufacturing a semiconductor component it is preferable for the semiconductor layer to be formed from an undoped semiconductor material.

It is also preferable for the doping material and the material of the additive layer to be non-metallic (apart from metal connections that do not release any metals), i.e. not to contain any free metal atoms or metal clusters, as a result of which, in particular, any undesired electrical conductivity is avoided. It is further preferable for the doping material and the material of the additive layer to be free of metal.

In terms of the method for manufacturing a semiconductor component the opportunities for configuration that are described in the context of the semiconductor component, and the advantages that are linked with these, exist concurrently.

BRIEF DESCRIPTION OF THE DRAWINGS

In what follows the invention is explained in more detail with the aid of preferred examples of embodiment with reference to the figures of a drawing. Here:

FIG. 4b shows a schematic sectional representation along a line AA' of the transistor arrangement in FIG. 4a;

FIG. 5b shows a schematic sectional representation along a line AK of the further transistor arrangement in FIG. 5a;

FIG. 6a shows a schematic representation of another transistor arrangement, and

FIG. 6b shows a schematic representation of the other transistor arrangement from FIG. 6a.

FIG. 2 shows a schematic representation of an organic field effect transistor with a source electrode 20a and a drain electrode 20b, which are both manufactured on an injection layer 21. The injection layer 21 consists of a molecular doping material, which forms an electrical dopant for the organic material of an adjacent channel layer 22. The organic channel layer 22 for its part is formed on an insulator layer 23 (a dielectric layer, also called a gate isolator layer) to which a gate electrode 20c is connected on the underside.

Figure 1:
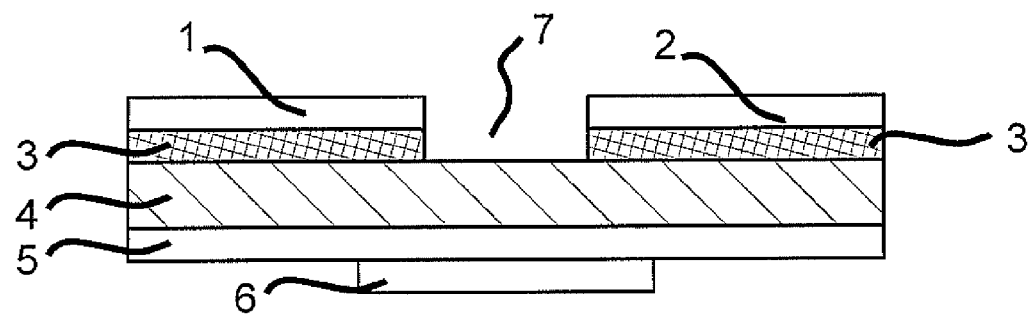
FIG. 1 shows a schematic representation of a field effect transistor in accordance with the prior art.

In all figures the gate electrode is shown as being smaller than the channel width, in order to simplify the representation. In reality the gate electrode is preferably larger than the channel width.

An additive layer 25 of an additive material (compensation material) is applied in a region 24 between the source electrode 20a and the drain electrode 20b; the additive material takes the form of a material that is complementary to the molecular doping material of the injection layer 21.

First interfacial surface regions 26 are formed between the source electrode 20a and the drain electrode 20b on the one hand, and the injection layer 21 on the other hand, A second interfacial surface region 27 is formed between the additive layer 25 and the injection layer 21. By virtue of the neutralising or compensating action of the additive material of the additive layer 25 with reference to the doping strength of the molecular doping material in the injection layer 21, layered regions 28 are created, as well as a further layered region 29; these layered regions differ, in terms of their electrical doping affinity of the molecular doping material, with reference to the organic material of the channel layer 22. While in the layered regions 28 the molecular doping material can develop its electrical action as an injection layer without any inhibition from the additive material in the additive layer 25, the said electrical doping action is inhibited in the further layered region 29, or even neutralised completely. In the further layered region 29 the injection layer 21 is also essentially non-conducting electrically.

In one configuration of the invention the method comprises the following steps:
  manufacture of the injection layer 21,
  manufacture of the electrodes in contact with the injection layer 21, wherein the electrodes partially cover the injection layer 21, and
  manufacture of the additive layer 25, which is applied with touching contact onto at least those regions of the injection layer 21 that are not covered by the electrodes.

Figure 2:
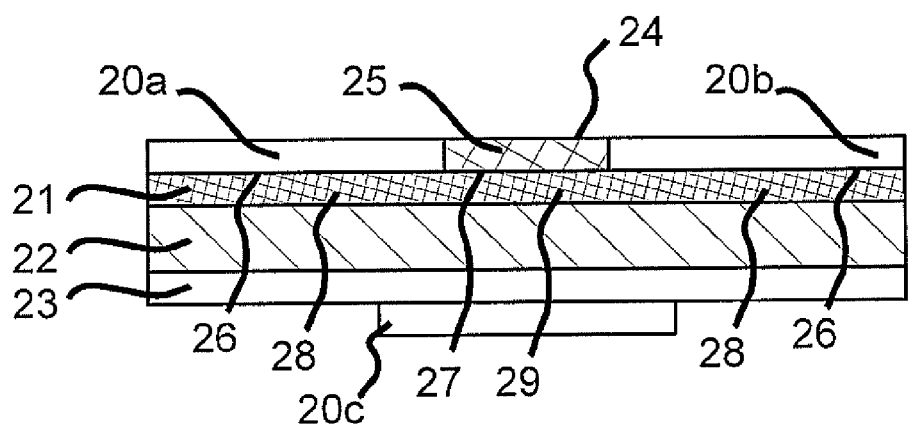
FIG. 2 shows a schematic representation of a field effect transistor, in which in a region between the source and drain electrodes an additive layer is applied onto an injection layer.
Figure 3:
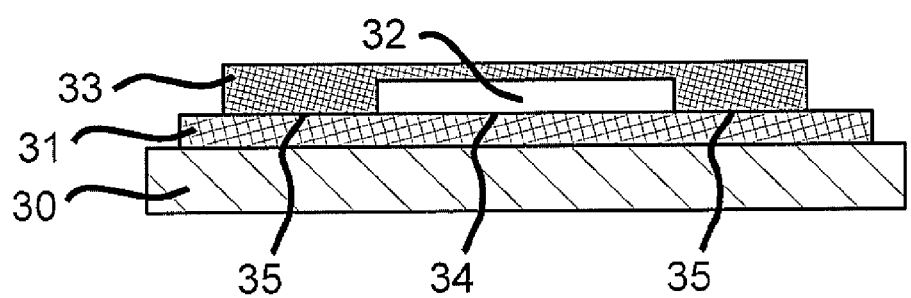
FIG. 3 shows a schematic representation of part of a semiconductor component with an injection layer and an additive layer.

FIG. 3 shows a schematic representation of a semiconductor component, in which an injection layer 31 of a molecular doping material is arranged on an organic semiconductor layer 30 of organic material. An electrode 32 and an additive layer 33 are deposited on the injection layer 31. Thus a first interfacial surface region 34 is formed, which is comparable with the first interfacial surface regions 26 in FIG. 2; also formed are second interfacial surface regions 35, which are comparable with the second interfacial surface region 27 in FIG. 2. The interaction between the additive layer 33 and the injection layer 31 corresponds to the comments made above with reference to FIG. 2.

Application of the inverters that are described in FIGS. 4 to 6, and other gates that can be manufactured with the invention, enables the manufacture of current-efficient organic switching circuits.

Figure 4A:
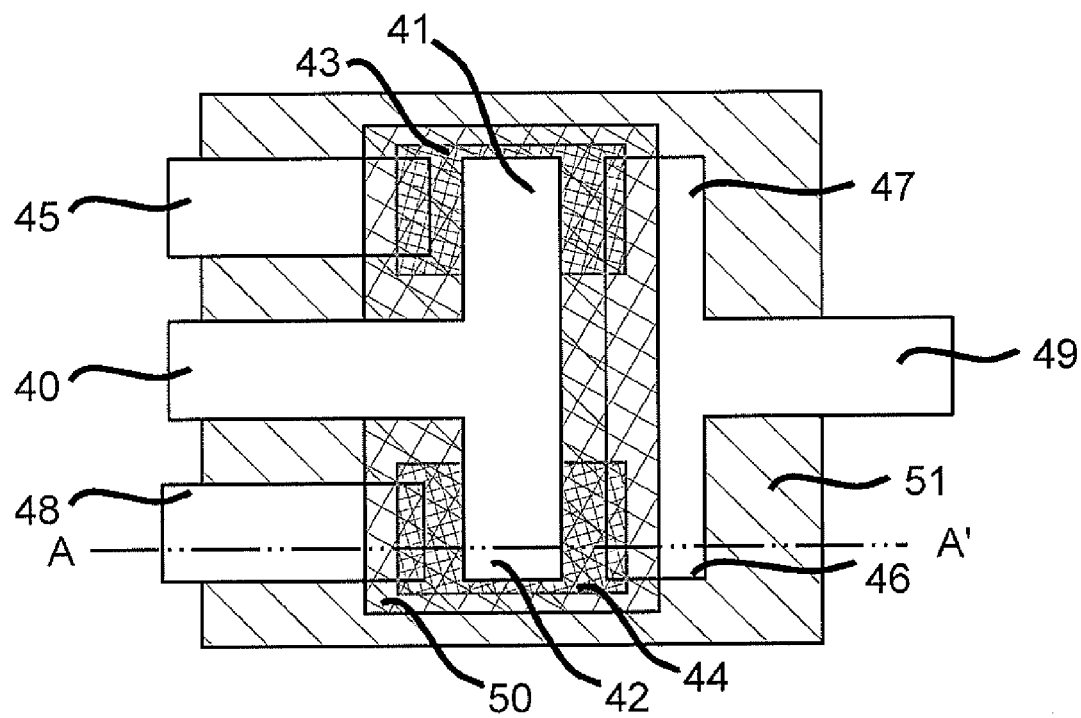
FIG. 4a shows a schematic representation of a transistor arrangement.

FIG. 4a shows a schematic representation of a transistor arrangement with two organic thin-film transistors (TFTs), which together form an inverter (a NOT-gate). An input 40 is connected with gate electrodes 41, 42 of the two transistors, which are formed as a p-channel transistor (the upper transistor in FIG. 4a) and an n-channel transistor (the lower transistor in FIG. 4a). Underneath the gate electrodes 41, 42 and above the electrodes 45, 46, 47, 48 respective additive layers 43, 44 are formed; these overlap with drain electrodes 45, 46 and source electrodes 47, 48 of the two transistors. The source electrode 47 of the one transistor and the drain electrode 46 of the other transistor are connected with an output 49. Furthermore a gate isolator layer 50 is provided. The transistor arrangement is formed on a semiconductor 51. An ambipolar semiconductor material is preferably used, wherein the charge carrier mobilities $\mu\_h$ and $\mu\_e$ differ by less than two orders of magnitude. In an alternative to FIG. 4a the gate electrode 41 and the gate isolator layer 50 can be formed underneath the semiconductor layer 50. The substrate is not shown in the figures; it can, for example, be glass or plastic. The gate isolator layer 50 can also serve as a substrate.

Figure 4B:
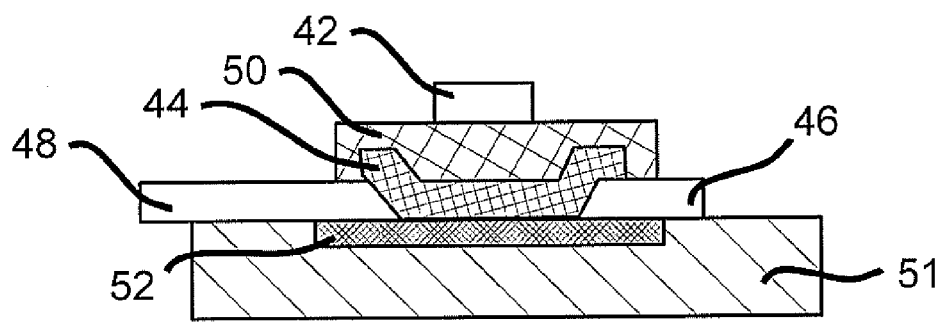

FIG. 4b shows a schematic sectional representation of the transistor arrangement on FIG. 4a along a line AA'. From FIG. 4b it can be seen in particular that an injection layer 52 is formed underneath the gate isolator layer 50; the edges of this injection layer overlap with the source electrode 48 and the drain electrode 46.

Figure 5A:
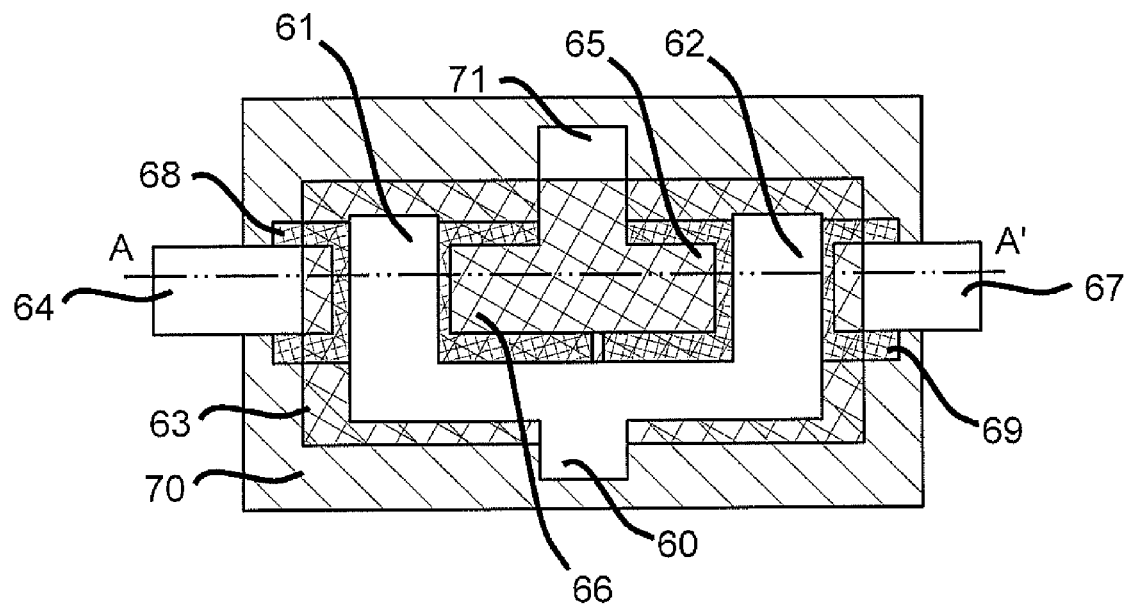
FIG. 5a shows a schematic representation of a further transistor arrangement.

FIG. 5a shows a schematic representation of a further transistor arrangement with two organic thin-film transistors; these are embodied as an n-channel transistor and a p-channel transistor. An input 60 is connected with the respective gate electrodes 61, 62 of the two transistors. A gate insulator layer 63 overlaps the two gate electrodes 61, 62. The two transistors, of which the transistor on the left-hand side in FIG. 5a is embodied as a p-channel transistor, and the transistor on the right-hand side in FIG. 5a is embodied as an n-channel transistor, furthermore have in each case a drain electrode 64, 65 and a source electrode 66, 67. An ambipolar semiconductor material is preferably used, wherein $\mu\_h$ and $\mu\_e$ differ by less than two orders of magnitude. In an alternative to FIG. 5a the gate electrodes 61, 62 and the gate isolator layer 63 can be formed underneath the semiconductor layer 70.

Furthermore in accordance with FIG. 5a two injection layers 68, 69 are formed. The transistor arrangement is arranged on a semiconductor 70, on which is formed an output 71, which is connected with the source electrode 66 and also the drain electrode 65.

Figure 5B:
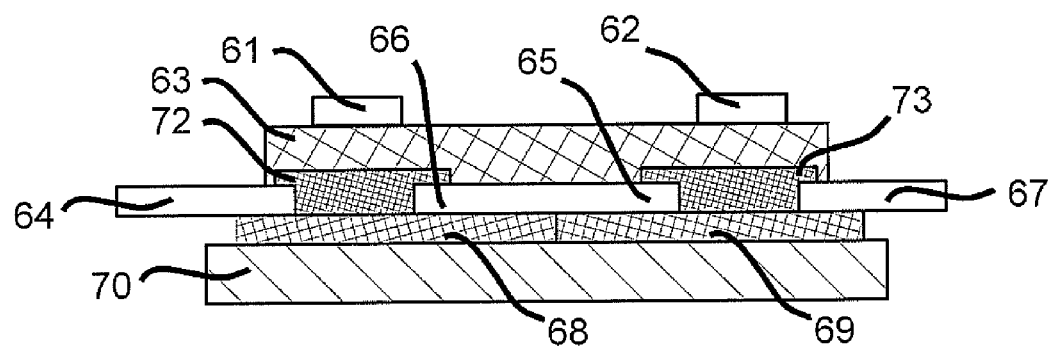

FIG. 5b shows a schematic sectional representation of the further transistor arrangement from FIG. 5a along a line AA'. In FIG. 5b two additive layers 72, 73 can also be seen.

FIG. 6a shows a schematic representation of another transistor arrangement with two transistors, which are formed as organic thin-film transistors in n-channel and p-channel embodiments. The other transistor arrangement is arranged on a semiconductor substrate 80. An input 81 and an output 82 are provided. The input 81 is connected with the gate electrodes 83, 84 of the two transistors. In a manner comparable to that of the above described transistor arrangements injection layers 85, 86 and additive layers 87, 88 are provided. Furthermore a drain electrode 89 of the upper transistor in FIG. 6a is formed, as is a source electrode 90 of the lower transistor in FIG. 6a. An ambipolar semiconductor material is preferably used, wherein $\mu\_h$ and $\mu\_e$ differ from one another by less than two orders of magnitude. In an alternative to FIG. 6a the gate electrodes 83, 84 and the gate isolator layer 91 can be formed underneath the semiconductor layer 80.

FIG. 6b shows a schematic sectional representation of the other transistor arrangement in FIG. 6a. In FIG. 6b another gate isolator layer 91 can be seen, as can a gate electrode 92, which is connected with the input 81.

Independently of the forms of embodiment described for transistor arrangements, one or a plurality of the following features can be implemented in the individual configurations. The gate electrodes can be manufactured above or underneath on the arrangement. The gate electrode can overlap with the channel of the respective transistor and the drain/source electrodes. The separation distance between the drain/source electrodes is preferably less than 10 μm, more preferably less than 5 μm. Typically the electrode separation distance is smaller than the separation distance between adjacent components in the arrangement.

The injection layer 21 is to be formed from a doping material that is a dopant for the semiconductor layer. Otherwise the injection is not fully effective. Between the semiconductor layer and the electrode there is only the injection layer and no further layer. Here the electrode is a conductive layer, for example, a degenerate system such as a metal, a metal alloy, ITO, or similar. The dopant is an electrical dopant, which modifies the free charge carrier density and the location of the Fermi level. Preferably it does not react chemically with the matrix of the semiconductor layer.

In the case in which the injection layer consists of an n-dopant and the additive layer contains a p-dopant (or is preferably formed from the latter), it is preferable for the LUMO of the p-dopant to be lower (more negative) than the LUMO of the semiconductor layer, preferably lower by more than 1 eV. In the case in which the injection layer consists of a p-dopant and the additive layer contains an n-dopant (or is preferably formed from the latter), it is preferable for the HOMO of the n-dopant to be higher (more positive) than the HOMO of the semiconductor layer, preferably higher by more than 1 eV. In both cases it is preferable for the energy difference between HOMO_n-dopant and LUMO_p-dopant to be greater than is the gap of the semiconductor layer, preferably greater than 2 eV.

The doping materials can, for example, be the following compounds: p-dopants in DE 103 57 044 (and correspondingly US 2005/121667), US 2008/265216, EP 2 180 029 A1; n-dopants in DE 103 47 856 (and correspondingly WO 05/036667), DE 10 2004 010 954 (and correspondingly WO 05/086251) or a precursor compound such as is described, for example, in DE 103 07 125 (and correspondingly US 2005/040390) or DE10338406 (and correspondingly US 2005/061232). The respective subject matter of the above-cited documents is incorporated by means of reference.

In many cases it is advantageous if for p-doping (n-doping) the LUMO of a p-dopant (HOMO of the n-dopant is a maximum of 0.5 eV greater (a maximum of 0.5 eV less than) the HOMO (LUMO) of a p-type (n-type) matrix. Likewise it is advantageous if for n-doping the HOMO of an n-dopant is a maximum of 0.5 eV less than the LUMO of an n-type matrix. Here in accordance with convention the quantities HOMO and LUMO respectively are considered to be equal in terms of magnitude to the ionisation potential or electron affinity, although the electron affinity has an opposite sign.

Additive materials can be electron-rich tolans, which in a [2+2] cycloaddition and subsequent retro-electrocyclisation react with p-dopants (to form tetracyanobutadienes). The tolans used can be unsubstituted or substituted, wherein Ar1 and Ar2 respectively can be different triarylamines.

EXAMPLE

Reaction Mechanism

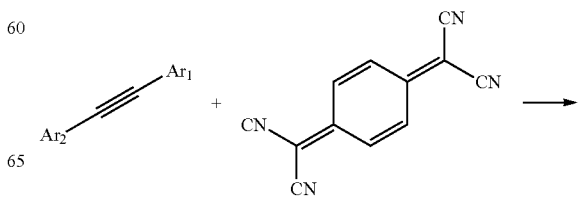

-continued

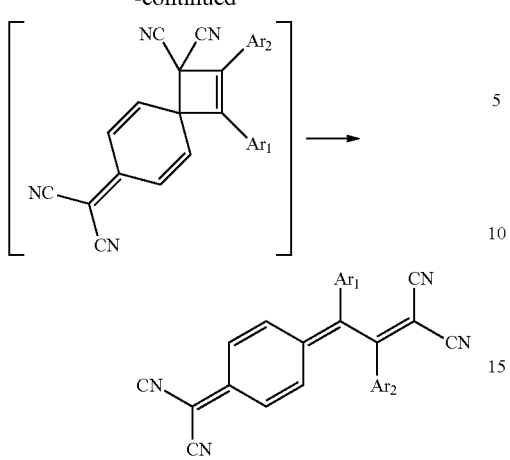

The following compounds are examples of additive materials:

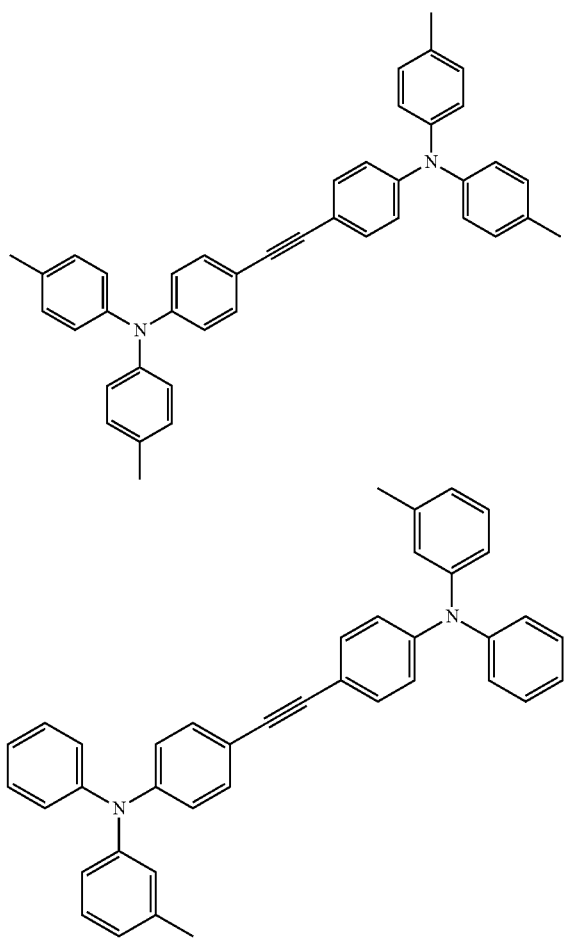

It has been established that additive materials with one alkyne unit or more (C≡C) with p-doping materials in the sold body state react with one another chemically, and that the product of the reaction is not a strong dopant. For the application of such materials it is preferable if the corresponding tolans are also of low volatility and can be processed in a vacuum, i.e. the materials should have a vaporisation temperature in a vacuum that is at least 85° C., preferably >100° C.

It is preferable for the additive materials to contain a carbocycle, it is more preferable for the at least one carbocycle to be part of a conjugate system; this ensures that the product of the reaction does not represent a strong dopant (the product is weaker than the initial doping material of the injection layer).

It is preferable for the material of the injection layer to be fully neutralised. For this reason it is preferable for more molecules per surface area to be present in the additive layer.

The number of molecules (N) in a volume (V) can be determined with the known density (p) and the molecular mass (mw) (where NA represents Avagadro's constant).

$$N = \frac{pV}{N_A m_w}$$

Because the surface in the reaction region is the same, the equation is only a function of the layer thickness. Thus the number of molecules for both layers can be calculated from the following equations:

$$N_{AL} = \frac{p_{AL}}{m_{w_{AL}}} \frac{d_{AL}}{N_A}$$

$$N_{IL} = \frac{p_{IL}}{m_{w_{IL}}} \frac{d_{IL}}{N_A}$$

where IL is the index for the injection layer and AL is the index for the additive layer.

$$N_{AL} \geq N_{IL}$$

Here the lower limit is at approximately 0.5:

$$N_{AL} \geq 0.5 N_{IL}$$

A slight, but limited, surplus of AL is preferred:

$$N_{AL} \leq 1.5 N_{IL}$$

In order to complete the reaction, the interfacial surface between the two materials must be large, something that can only be achieved by means of very thin layer thicknesses. It is preferable for the nominal layer thickness of the injection layer to be a maximum of 5 nm, more preferably a maximum of 1.5 nm.

The layer thickness is a nominal layer thickness. This is calculated from the mass that is deposited on a known surface area. For this purpose the density of the material is used. For example, if the VTE method of manufacture is used the layer thickness is that which is displayed on the layer thickness monitor. If the layer thickness is measured directly, e.g. with a profilometer, circumstances can occur in which the layer thickness is difficult to measure. If the layers are very rough an average value is to be used if necessary.

In what follows examples of embodiment of transistors are described.

Example 1

Transistor without an Injection Layer (Prior Art)

A transistor was fabricated as follows: A substrate with an ITO gate electrode was coated with an 800 nm thick PMMA layer. The PMMA layer was fabricated by means of spin-coating from a THF solution. Here other conventional gate electrodes and gate isolators could also be deployed. A 50 nm thick pentacene semiconductor layer was fabricated on the PMMA layer. The Au electrodes were fabricated on the semiconductor layer, such that the channel had a width of 100 μm and a length of 1 cm.

On the transistor a reverse leakage current of 3.8E-11 and an on/off ratio at 60 V of 1.66E4 were measured. The mobility calculated is 0.003 cm2/Vs.

Example 2

Transistor with an Injection Layer

A transistor was manufactured in accordance with Example 1, wherein a 0.5 nm thick injection layer of dicyano-2,3,5,6,7,8-hexyluoro-1,4-naphthoquinonediimine was used on the semiconductor layer and under the electrodes. On the transistor a higher reverse leakage current of 2.2E-10 and a higher on/off ratio at 60 V of 6.63E4 were measured. The mobility calculated was 0.07 cm2/Vs. Very similar results were obtained with an injection layer of 2,2'-(perfluoronaphthalene-2,6-diylidene)dimalononitrile.

Example 3

Transistor with an Injection Layer and an Additive Layer

A transistor was manufactured in accordance with Example 2 wherein a 0.5 nm thick additive layer of tetrakis (1,3,4,6,7,8-hexahydro-2H-pyrimido[1,2-a]pyrimidiato)ditungsten was used on the semiconductor layer and on the electrodes. On the transistor a reduced reverse leakage current of 1E-10 and an increased on/off ratio at 60 V of 1.3E5 were measured. The mobility calculated was 0.06 cm2/Vs.

Example 4

Example 3 was repeated with a 1 nm thick injection layer. On the transistor a reverse leakage current of 2.5E-10 and an on/off ratio at 60 V of 7.2E4 were measured. The mobility calculated was 0.07 cm2/Vs.

Example 5

Example 4 was repeated with a 1 nm thick additive layer. On the transistor a reduced reverse leakage current of 5.6E-11 and an on/off ratio at 60 V of 2.3E5 were measured. The mobility calculated was 0.05 cm2/Vs.

Example 6

Example 4 was repeated with a 1 nm thick injection layer of bis(2,2':6',2''-terpyridin)ruthenium and a 1 nm thick additive layer of F4TCNQ. On the transistor a lower reverse leakage current of 4E-11 and an on/off ratio at 60 V of 3E5 were measured. The mobility calculated was 0.05 cm2/Vs.

Example 7

Example 4 has been repeated with a 1 nm thick additive layer of 4,4'-(ethyne-1,2-diyl)bis(N,N-diphenylaniline). On the transistor a lower reverse leakage current of 3E-11 was measured and an on/off ratio of 3E5 at 60 V.

The examples were also repeated with other electrodes. In the case of Al an improvement of on/off ratio of up to two orders of magnitude was measured.

In transistors with a channel width of less than 10 μm similar results were achieved. The on/off ratio had significantly improved compared with the prior art.

The features of the invention disclosed in the previous description, the claims, and the drawing can be important, both individually and also in any combination with each other, for the implementation of the invention in its various forms of embodiment.

The invention claimed is:

1. A semiconductor component comprising a layered arrangement, the layered arrangement comprising:
   an electrode comprising an electrode material;
   an organic semiconductor layer comprising an organic material;
   an injection layer, which
      is arranged between the electrode and the organic semiconductor layer, and
      consists of a molecular doping material, which is an electrical dopant for the organic material of the organic semiconductor layer; and
   an additive layer, which
      is arranged on the injection layer on the side of the injection layer facing the electrode, and
      consists of an additive material, which on contact with the molecular doping material modifies its doping affinity with respect to the organic material of the organic semiconductor layer,
   wherein the injection layer comprises a first layered region that has a first doping affinity of the molecular doping material with respect to the organic material, and a second layered region that has a second doping affinity of the molecular doping material with respect to the organic material, wherein the second doping affinity is smaller than the first doping affinity.

2. The semiconductor component in accordance with claim 1, wherein,
   the injection layer contacts the electrode and the organic semiconductor layer, such that a first interfacial surface region is formed between the electrode and the injection layer;
   the additive layer is arranged on the injection layer on the side of the injection layer facing the electrode, such that a second interfacial surface region is formed between the additive layer and the injection layer; and
   the first layered region is formed opposite the first interfacial surface region, and the second layered region is formed opposite the second interfacial surface region.

3. The semiconductor component in accordance with claim 1, wherein the molecular doping material has a molecular weight of at least 300 g/mol.

4. The semiconductor component doping material in accordance with claim 2, wherein the first interfacial surface region and the second interfacial surface region are adjacent to one another.

5. The semiconductor component in accordance with claim 1, wherein for the organic material of the organic semiconductor layer, the molecular doping material of the injection layer is an electrical p-dopant, and the additive material of the additive layer is an electrical n-dopant, or vice versa.

6. The semiconductor component in accordance with claim 1, wherein the additive material comprises a material that diminishes the doping affinity of the molecular doping material with respect to the organic material due to a chemical reaction between the additive material and the molecular doping material.

7. The semiconductor component in accordance with claim 1, wherein the additive material comprises a material that diminishes the doping affinity of the molecular doping material with respect to the organic material due to the formation of a salt between the additive material and the molecular doping material.

8. The semiconductor component in accordance with claim 1, wherein the additive layer at least partially covers the electrode on a side of the electrode facing away from the injection layer.

9. The semiconductor component in accordance with claim 1, wherein the additive layer is arranged between the electrode and at least one second electrode.

10. A method for producing a semiconductor component, wherein the method comprises the following steps:
   producing an electrode of an electrode material;
   producing an organic semiconductor layer of an organic material;
   producing an injection layer, wherein the injection layer
      is formed between the electrode and the organic semiconductor layer, and
      consists of a molecular doping material, which is an electrical dopant for the organic material of the organic semiconductor layer; and
   producing an additive layer, wherein the additive layer
      is formed on the injection layer on the side of the injection layer facing towards the electrode, and
      consists of an additive material, which on contact with the molecular doping material and/or subsequent activation with the molecular doping material modifies its doping affinity with respect to the organic material of the organic semiconductor layer,
   wherein the injection layer comprises a first layered region that is formed with a first doping affinity of the molecular doping material with respect to the organic material, and a second layered region that is formed with a second doping affinity of the molecular doping material with respect to the organic material, wherein the second doping affinity is smaller than the first doping affinity.

11. The method in accordance with claim 10, wherein the method comprises the following steps:
   producing the injection layer such that the injection layer is formed in contact with the electrode and the organic semiconductor layer, such that a first interfacial surface region is formed between the electrode and the injection layer;
   producing the additive layer such that a second interfacial layer region is formed between the additive layer and the injection layer; and
   forming of the first layered region opposite to the first interfacial surface region, and the second layered region opposite to the second interfacial surface region.

12. An application of a semiconductor component in accordance with claim 1 in an organic transistor or a passive matrix display.

13. An inverter, with two semiconductor components in accordance with claim 1.

14. The semiconductor component in accordance with claim 1, wherein for the organic material of the organic semiconductor layer, the molecular doping material of the injection layer is an electrical n-dopant, and the additive material of the additive layer is an electrical p-dopant.

* * * * *